US008819287B2

(12) United States Patent
Alkire

(10) Patent No.: US 8,819,287 B2
(45) Date of Patent: Aug. 26, 2014

(54) SYSTEM AND METHOD FOR COMPRESSING URL REQUEST PARAMETERS

(75) Inventor: Robert J. Alkire, Flower Mound, TX (US)

(73) Assignee: CA, Inc., Islandia, NY (US)

( * ) Notice: Subject to any disclaimer, the term of this patent is extended or adjusted under 35 U.S.C. 154(b) by 1711 days.

(21) Appl. No.: 11/259,159

(22) Filed: Oct. 25, 2005
(Under 37 CFR 1.47)

(65) Prior Publication Data

US 2007/0168560 A1  Jul. 19, 2007

(51) Int. Cl.
*G06F 15/16* (2006.01)

(52) U.S. Cl.
USPC .......................................................... 709/247

(58) Field of Classification Search
USPC .......................................................... 709/247
See application file for complete search history.

(56) References Cited

U.S. PATENT DOCUMENTS

| | | | | |
|---|---|---|---|---|
| 5,764,910 A * | 6/1998 | Shachar | | 709/223 |
| 5,915,098 A * | 6/1999 | Palmer et al. | | 709/247 |
| 5,956,490 A * | 9/1999 | Buchholz et al. | | 709/245 |
| 6,118,391 A * | 9/2000 | Wecker | | 341/55 |
| 6,166,666 A * | 12/2000 | Kadyk | | 341/87 |
| 6,286,053 B1 * | 9/2001 | Van Peursem et al. | | 709/247 |
| 6,335,933 B1 * | 1/2002 | Mallory | | 370/394 |
| 6,345,307 B1 * | 2/2002 | Booth | | 709/247 |
| 6,370,581 B2 * | 4/2002 | Rader | | 709/230 |
| 6,397,259 B1 * | 5/2002 | Lincke et al. | | 709/236 |
| 6,493,766 B1 * | 12/2002 | Buchholz et al. | | 709/247 |
| 6,598,051 B1 * | 7/2003 | Wiener et al. | | 1/1 |
| 6,701,317 B1 * | 3/2004 | Wiener et al. | | 1/1 |
| 6,934,767 B1 * | 8/2005 | Jellinek | | 709/247 |
| 6,957,224 B1 * | 10/2005 | Megiddo et al. | | 1/1 |
| 7,519,688 B2 * | 4/2009 | Behrens et al. | | 709/219 |
| 7,908,317 B2 * | 3/2011 | Musson | | 709/203 |
| 7,949,673 B2 * | 5/2011 | Vanrenen et al. | | 707/769 |
| 8,418,203 B1 * | 4/2013 | Nishio et al. | | 725/42 |
| 8,499,099 B1 * | 7/2013 | Kogan | | 709/245 |
| 2001/0032254 A1 * | 10/2001 | Hawkins | | 709/219 |
| 2002/0107986 A1 * | 8/2002 | Pfohe et al. | | 709/246 |
| 2002/0133570 A1 * | 9/2002 | Michel | | 709/219 |
| 2002/0143984 A1 * | 10/2002 | Hudson Michel | | 709/238 |
| 2003/0105807 A1 * | 6/2003 | Thompson et al. | | 709/203 |
| 2003/0208563 A1 * | 11/2003 | Acree et al. | | 709/219 |
| 2003/0233514 A1 * | 12/2003 | Honig | | 711/108 |
| 2004/0001010 A1 * | 1/2004 | Shaylor et al. | | 341/50 |
| 2005/0033745 A1 * | 2/2005 | Wiener et al. | | 707/10 |
| 2008/0307044 A1 * | 12/2008 | Musson | | 709/203 |

FOREIGN PATENT DOCUMENTS

JP      2003141002 A  *  5/2003

OTHER PUBLICATIONS ("A Quick Tutorial on Generating a Huffman Tree", siggraph.org, 3 pages, Mar. 16, 2002, http://web.archive.org/web/20020316221434/http://www.siggraph.org/education/materials/HyperGraph/video/mpeg/mpegfaq/huffman_tutorial.html).*
ASP ("What is the limit on Querystring/GET/URL parameters", http://classicasp.aspfaq.com/forms/what-is-the-limit-on-querystring/get/url-parameters.html, 2001, p. 1).*

(Continued)

*Primary Examiner* — Imad Hussain
(74) *Attorney, Agent, or Firm* — Baker Botts, LLP

(57) ABSTRACT

Method and system for compressing URL request parameters is provided. At least a portion of a URL is converted from a first form into at least a second form and communicated.

44 Claims, 8 Drawing Sheets

(56) References Cited

OTHER PUBLICATIONS

Yergeau (RFC 2279, http://www.ietf.org/rfc/rfc2279.txt, Jan. 1998, pp. 1-8).), in view of Booth (U.S. Patent No. 6,345,307).*
Snellm et al. "Encoding/compress CGI GET parameters". Jan. 17, 2001. http://www.perlmonks.org/?node_id=52504 pp. 1-11.*
Prolific et al. "We want 'em shorter". Jul. 10, 2001. http://www.metafilter.com/8916/We-want-em-shorter pp. 1-4.*
Wikipedia. "TinyURL". Sep. 1, 2013. http://en.wikipedia.org/wiki/TinyURL pp. 1-2.*
Communication pursuant to 94(3) EPC, Application No. 04 754 385.5-2413, Ref. No. HCD/J0048378EP, 2 pages, Jan. 10, 2009.

* cited by examiner

SYSTEM AND METHOD FOR COMPRESSING URL REQUEST PARAMETERS

CROSS REFERENCE TO RELATED APPLICATIONS

This application is a continuation of U.S. application Ser. No. 11/068,201, filed Feb. 28, 2005, which claims priority to U.S. application Ser. No. 10/861,150, filed Jun. 4, 2004, and which claims priority to U.S. Application Ser. No. 60/476,715, filed Jun. 6, 2003, entitled "System and Method for Providing Compressed URL Request Parameters," by Robert J. Alkire, which is incorporated herein by reference.

BACKGROUND

1. Technical Field

The present disclosure relates generally to web communication and, more particularly, to a method and system for compressing URL request parameters.

2. Description of the Related Art

Web page communication involves communicating information back and forth with a web page. Every web site can be made up of one or more web pages and the content for the web pages can be written in a HyperText Markup Language (HTML), a language that governs how web pages are formatted and displayed. Hypertext Transfer Protocol (HTTP) can define how HTML pages are formatted and transmitted and what actions a web browser and web server can take in response to various HTTP requests. For example, entering a Uniform Resource Locator (URL) into a web browser sends an HTTP request to a web server directing it to obtain and transmit the desired page.

A URL is used to reference resources on the Internet and can consist of a protocol identifier and a resource name. The protocol identifier can indicate the name of the protocol that is being used to obtain a resource, for example, HTTP, FTP, File, News, Gopher, etc. The resource name can include a host name, filename, port number, reference, etc. The host name is the name of the machine where the resource can be located and the filename is the pathname to the file on the machine. The port number is the port that the request can connect to and the reference can identify a specific location within a file.

When a web client using a web browser submits information to a web server, this information can be appended to the URL and sent to the web server. However, many web browsers may have a limit on the number of characters that can be used for an HTTP request. Different browsers may have different restrictions on the URL length. For example, if a web client wants to create a new record and the amount of characters exceed a maximum amount, then the web client or server may no longer respond.

Accordingly, it would be beneficial to provide a reliable and effective way to compress request parameters in order to ensure that a web browser can transmit a maximum amount of data for a request.

SUMMARY

A method for compressing URL request parameters, according to an embodiment of the present disclosure, includes converting at least a portion of a URL from a first form into at least a second form, and communicating the converted URL.

A system for compressing URL request parameters, according to an embodiment of the present disclosure, includes means for converting at least a portion of a URL from a first form into at least a second form; and means for communicating the converted URL.

A computer storage medium including computer executable code for compressing URL request parameters, according to an embodiment of the present disclosure, includes code for converting at least a portion of a URL from a first form into at least a second form, and code for communicating the converted URL.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein.

DETAILED DESCRIPTION

The present disclosure provides tools (in the form of methodologies, apparatuses, and systems) for compressing URL request parameters. The tools may be embodied in one or more computer programs stored on a computer readable medium or program storage device and/or transmitted via a computer network or other transmission medium.

The following exemplary embodiments are set forth to aid in an understanding of the subject matter of this disclosure, but are not intended, and should not be construed, to limit in any way the claims which follow thereafter. Therefore, while specific terminology is employed for the sake of clarity in describing some exemplary embodiments, the present disclosure is not intended to be limited to the specific terminology so selected, and it is to be understood that each specific element includes all technical equivalents which operate in a similar manner.

Figure 1:
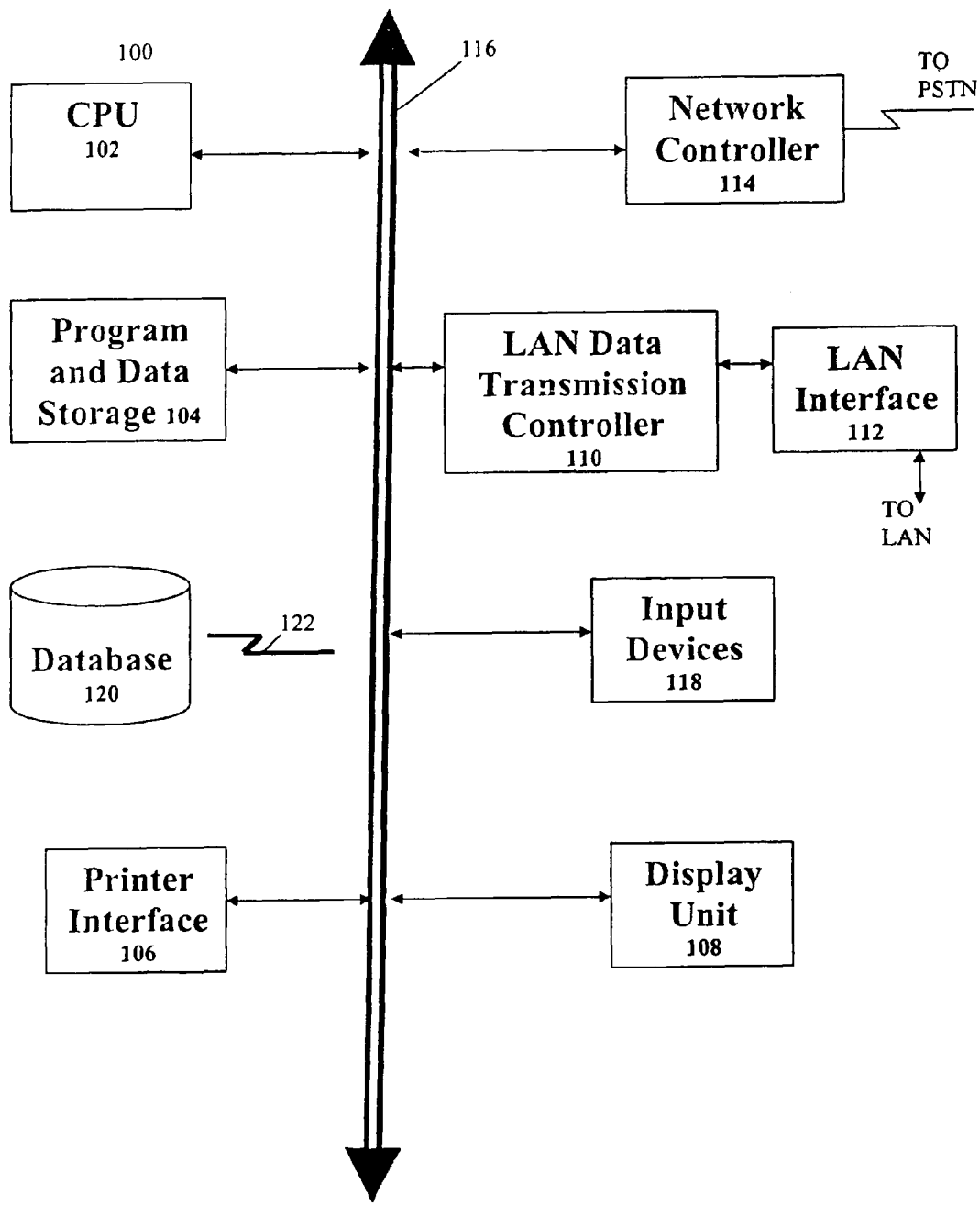
FIG. 1 shows a block diagram of an exemplary computer system capable of implementing the method and system of the present disclosure.

FIG. 1 shows an example of a computer system 100 which may implement the method and system of the present disclosure. The system and method of the present disclosure may be implemented in the form of a software application running on a computer system, for example, a mainframe, personal computer (PC), handheld computer, server, etc. The software application may be stored on a recording media locally accessible by the computer system, for example, floppy disk, compact disk, bard disk, etc., or may be remote from the computer system and accessible via a bard wired or wireless connection to a network, for example, a local area network, or the Internet.

The computer system 100 can include a central processing unit (CPU) 102, program and data storage devices 104, a printer interface 106, a display unit 108, a (LAN) local area network data transmission controller 110, a LAN interface 112, a network controller 114, an internal bus 116, and one or more input devices 118 (for example, a keyboard, mouse etc.). As shown, the system 100 may be connected to a database 120, via a link 122.

The specific embodiments described herein are illustrative, and many variations can be introduced on these embodiments without departing from the spirit of the disclosure or from the scope of the appended claims. Elements and/or features of different illustrative embodiments may be combined with each other and/or substituted for each other within the scope of this disclosure and appended claims.

According to an embodiment of the present disclosure, hexadecimal encoding together with Huffman encoding can be used with Unicode and multi-URL support. Unicode is a 16 bit character set that assigns unique character codes to characters in many different languages. Unlike ASCII, which defines 128 different characters, represented in 8 bits, there are as many as 65,536 distinct Unicode characters that represent the unique characters that are used in the many different languages.

The data portion of a URL can use decimal numbers (for example, Unicode character representations) delimited by commas. For example, the data portion of a URL may look like the following: 82,67,49,49,52,32,111,110,32,67,108. Such a representation may exceed the limit of characters that can be used for a request.

According to an embodiment of the present disclosure, the present method and system can convert the decimal values into hexadecimal values, significantly reducing the size of the data. Hexadecimal is a base 16 numbering system using the numbers are 0-9 and then the letters A-F, where the decimal number 10 corresponds to the letter A, the decimal number 11 corresponds to the letter B, etc. By using hexadecimal values instead of decimal values, the need for comma delimiters to separate the data is eliminated and the numbers can be represented by two hexadecimal characters instead of at least three decimal characters. For example, the data portion of the URL shown above can be represented in hexadecimal as follows: 5243313134206F6E20436C.

According to another embodiment of the present disclosure, an encoding can be performed to further reduce the size of the URL. For example, after converting the decimal characters to hexadecimal characters, a Huffman encoding algorithm that uses bits to represent the characters instead of bytes can be used to further compress the sixteen possible hexadecimal characters. Huffman encoding is a data compression technique that compacts data by representing more common characters with short codes and less common characters with longer codes. In this case, a Huffman tree for the encoding can be sent to the server so that the data can be decoded.

If the length of the encoded data, including the length of the Huffman tree is longer than the hexadecimal encoding, then it may not be efficient to have the data encoded. According to an embodiment of the present disclosure, a cut off point, for example, "MinEncodeLen", can be chosen to determine whether or not to allow the hexadecimal string to be Huffman encoded, based on the length of the original hexadecimal string.

If the Unicode characters have values that exceed hex 'FF' (one byte), for example, three byte and four byte characters, the Unicode characters can be grouped together with a single starting and ending delimiter. For example, a string of 60 four byte characters would only take two extra bytes for the starting and ending delimiters. For three byte characters, a leading zero can be added to make them into four byte characters. Accordingly, a string of 58 four byte characters 2 three byte characters can have only two extra bytes for the delimiters, plus an additional number of bits for the Huffman encoding of two leading zeros (approximately six bits on average). Additionally, if the string ends in double-byte Unicode characters, the last 'u' may not be utilized. Note, that the 'u' delimiters for double-byte Unicode blocks of characters can be used for the hexadecimal string whether or not further compression using Huffman encoding is done.

After the data is compressed, the data can be sent to a server. According to an embodiment of the present disclosure, the data portion of the URL string can be broken into blocks small enough to fit the URL length limit and if the data exceeds the limit, a flag can be used to indicate to the server that additional data remains on the client so that the server can request the additional data. The server can have a corresponding algorithm to decode the client's encoded data.

Figure 2:
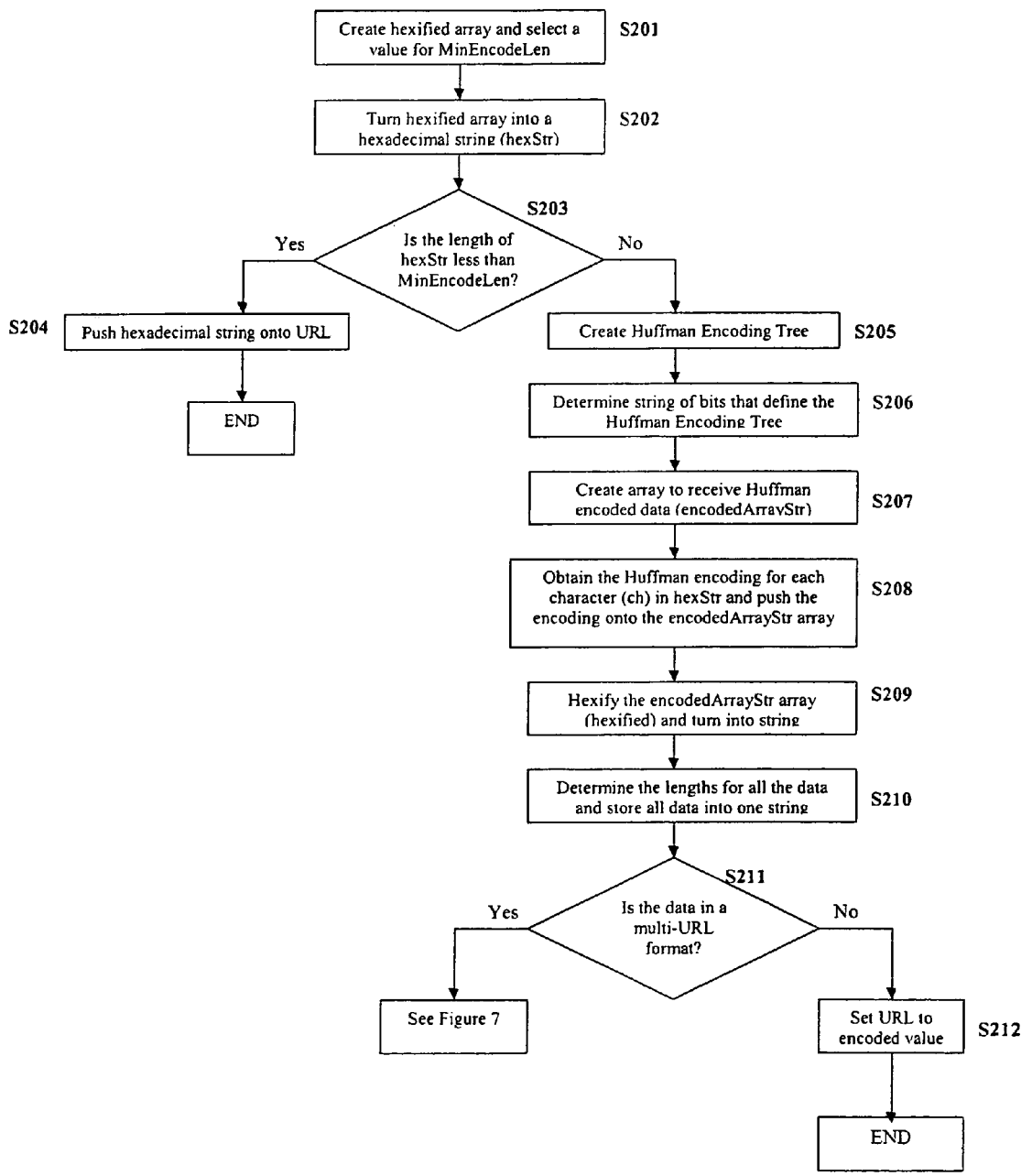
FIG. 2 shows a flow chart illustrating the description of the client side Javascript, according to an embodiment of the present disclosure.

The following is a description for implementing the above-described embodiments and is described with respect to FIG. 2. More specifically, the following is a description of the client side JavaScript for a web browser.

A function, buildURL(URL, pageData, URLParms) can begin the algorithm. A URL can be composed of an address and various parameters. For example, the last parameter may be the actual data. The entire URL prior to the actual data has a length 1, that can be stored in a variable "preDataLen". The "preDataLen" can be subtracted from a "MaxURLLen" constant that determines the maximum bytes of data allowed on the URL. This length should be less than the URL maximum limit imposed by, for example, Netscape or Internet Explorer browsers. Note that throughout the implementation, arrays can be used instead of string concatenation for performance reasons, although strings may suitably be used as desired. A variable, "partialURL" can be constructed by adding "thePath" and "URL". This variable contains the address of the server to which to send any additional data.

FIG. 2 is a flow chart illustrating a method for compressing URL request parameters, according to an embodiment of the present disclosure. A hexified array can be created and a predefined value for "MinEncodeLen" can be selected (Step S201). Different steps can be taken depending on whether a character is a single byte or multi-byte character (e.g., decimal value is greater than 255).

Figure 3:
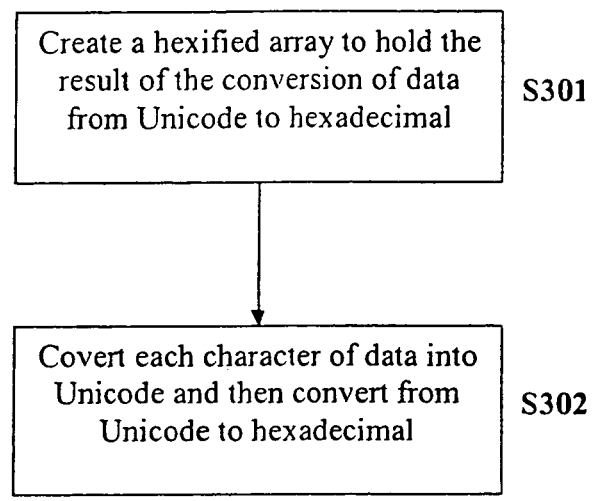
FIG. 3 shows a flow chart illustrating the conversion of data from Unicode into a hexadecimal format for single byte data, according to an embodiment of the present disclosure.

FIG. 3 is a flow chart illustrating the conversion of data from Unicode into a hexadecimal format for single byte data. A function hexify(pageData), can create a hexified array to hold the converted data (Step S301). Data can be converted into Unicode and then from Unicode into hexadecimal, based on an array lookup (Step S302). After the conversion, the hexadecimal values can be pushed onto the hexified array (Step S303).

Figure 4:
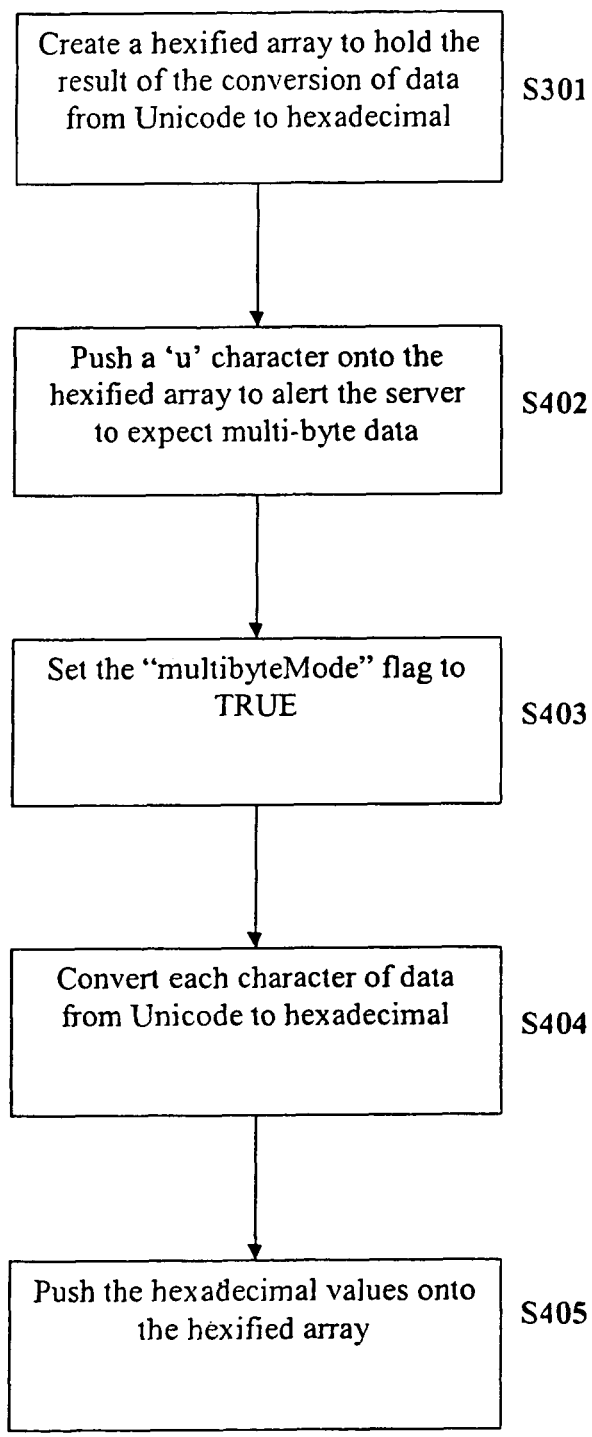
FIG. 4 shows a flow chart illustrating the conversion of data from Unicode into a hexadecimal format for multi-byte data, according to an embodiment of the present disclosure.

FIG. 4 is a flow chart illustrating the conversion of data from Unicode into a hexadecimal format for multi-byte data (e.g., decimal value is greater than 255). A function hexify (pageData), can create a hexified array to hold the converted data (Step S301). If not already in a "multibyteMode", a 'u' character can be pushed onto the hexified array to alert the server to expect multi-byte data (Step S402). The "multibyteMode" flag can be set to TRUE (Step S403). The characters can be converted into a high and low byte hexadecimal values (Step S404) and then pushed onto the hexified array (Step S405). Note that if the decimal value of the data is less than 255, a 'u' character can be pushed to terminate the character string, and the "multibyteMode" flag can be set to false.

The hexified array can be turned into a hexadecimal string, for example, "hexStr" (Step S202) by using for example, a Javascript Join(" ") operation. The variable "MinEncodeLen" can be used to determine whether to perform Huffman encoding in order to further compress the URL request parameter (Step S203). If the length of the hexadecimal string, "hexStr" is less than the variable "MinEncodeLen" (Yes, Step S203), then Huffman encoding might not be performed and the hexadecimal string, "hexStr", can be made part of the URL parameters (Step S204) by using, for example, purlParms.push(hexStr). However, if the length of the hexadecimal string, "hexStr" is not greater than the variable "MinEncodeLen" (No, Step S203), then Huffman encoding can be performed in order to further compress the URL request parameter, by using, for example, a function buildFreqTree(bexStr).

Figure 5:
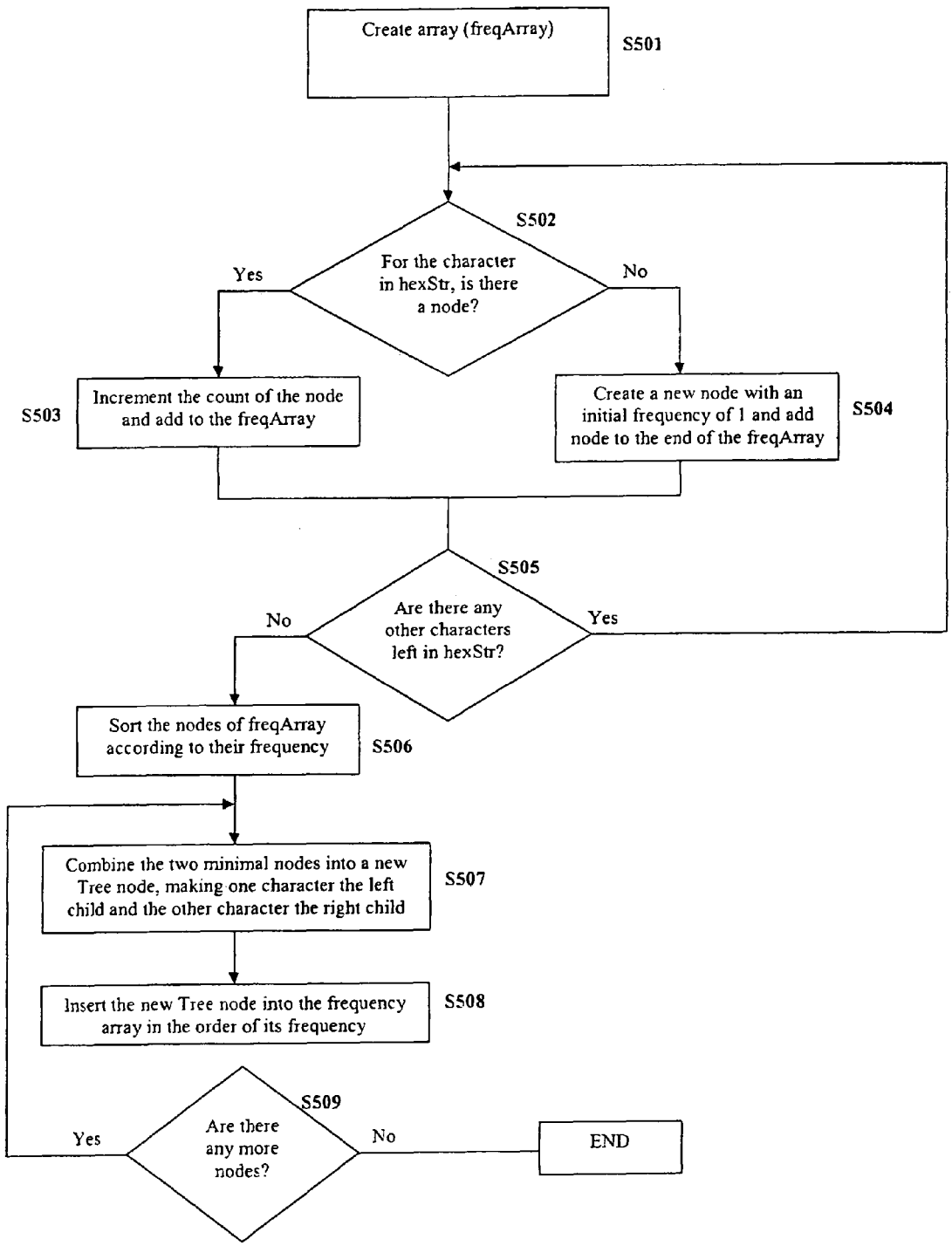
FIG. 5 shows a flow chart illustrating the creation of a Huffman encoding tree, according to an embodiment of the present disclosure.

A Huffman encoding tree can be created (Step S205). FIG. 5 provides a more detailed description of the creation of a Huffman encoding tree. An array, for example, "freqArray", can be created (Step S501) and filled with the characters from the hexadecimal string, "hexStr", by using, for example, the function findTreeNode(ch). The number of times a character occurs can be calculated and used to create an initial forest of one node trees. For example, each node can have a character and a weight equal to the number of times the character occurs. According to an embodiment of the present disclosure, if a node is found (Yes, Step S502), the frequency count of that node can be incremented and added to the frequency array, for example, "freqArray" (Step S503). However, if a node is not found (No, Step S502), a new tree node with an initial frequency of one can be created and added to the end of the frequency array (Step S504). The system can determine if there are any more characters in the hexadecimal string (Step S505). If there are (Yes, Step S505), the system will loop back to Step 503. However, if there no characters left in the hexadecimal string (No, Step S505), the frequency array can be converted from an unordered forest of nodes into a single Huffman tree by using, for example, a function buildCodeTree( ). The nodes of the frequency array can be repeatedly sorted in the order of their frequency (Step S506). A new TreeNode can be created by joining the two minimal nodes, where the character for the first node can be the left child and the character for the second node can be the right child (Step S507). The new TreeNode can then be inserted into the frequency array in the order of its frequency (Step S508), by using, for example, a function insertTreeNode(insertNode). If it is determined that there are nodes remaining (Yes, Step S509), Step 507-508 can be repeated for the remaining nodes.

Figure 6:
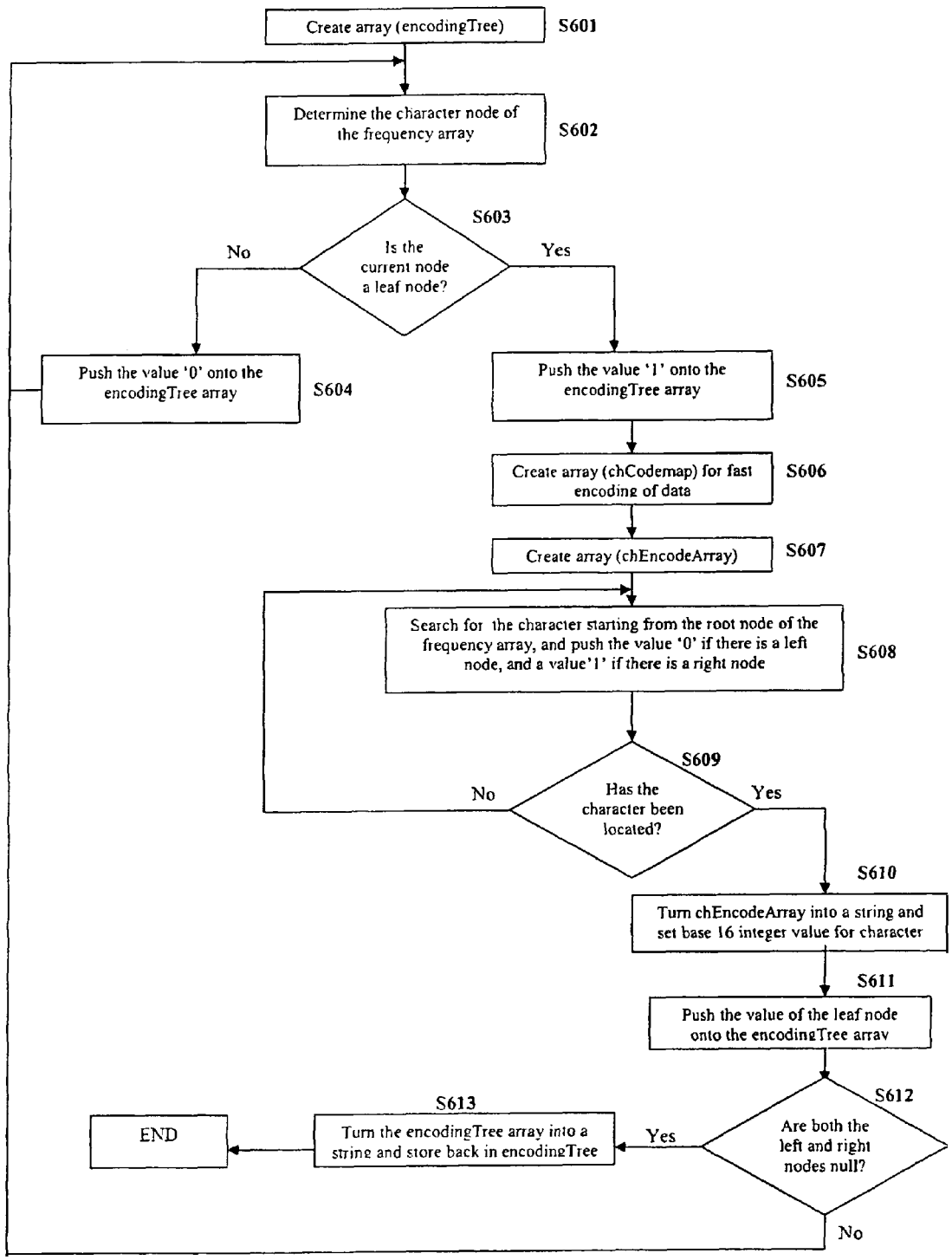
FIG. 6 shows a flow chart illustrating the creation of a Huffman encoded string, according to an embodiment of the present disclosure.

After the Huffman encoding tree is created, a string of bits that define the Huffman tree can be determined (Step S206). FIG. 6 provides a more detailed description of the creation of the Huffman encoded string. An array, for example, "encodingTree", can be created by a function, for example, getEncodingTree( ) (Step S601). The node of the frequency array can be determined, by using, for example, a function writeEncodingTreeNode(encodingTree) (Step S602). If the current node is not a leaf node (No, Step S603), a value of '0' can be pushed onto the encodingTree array (Step S604). However, if the current node is a leaf node (Yes, Step S603), then a value '1' can be pushed onto the encodingTree array (Step S605). If the node is a leaf node, then additional steps can occur. First, an array can be created, for example, "chCodemap" to act as a hash table enabling for fast encoding of data (Step S606). Another array, "chEncodeArray" can also be created (Step S607) and a recursive function can search for the character starting from the root node of the frequency array, pushing a value of '0' onto the "chEncodeArray" array if there is a left node, and a value of '1' onto the "chEncodeArray" array if there is a right node, until the character is found (Step S608). If the character is found (Yes, Step S609), the "chEncodeArray" can be turned into a string and the base 16 integer value can be set for the character in the "chCodeMap" array (Step S610). If the character is a 'u', the index of 16 can be set in the "chCodeMap" array. The value of the leaf node can then be pushed onto the "encodingTree" array (Step S611). If both the left and right nodes are empty (NULL) (Yes, Step S612), then the "encodingTree" array is turned into a string and stored back in the "encodingTree" array (Step S613).

A new array can be created to receive the Huffman encoded string, for example, "encodedArrayStr" (Step S207). For every character (ch) in the hexadecimal string (hexStr), the Huffman encoding is obtained by looking up the character (ch) in the chCodeMap array created in Step 610 (Step S208). The Huffman encoding for each character can be pushed onto the "encodedArrayStr" array (Step S208).

The "encodedArrayStr" array can be hexified and turned into another array of hexadecimal substrings, for example, "hexified" array (Step S209). A byte of data (equivalent to eight bit string characters) can be created, for example, by a function getHexy. If eight characters are not available, zeros can be added to complete the byte. The eight character bit string can be converted by a Javascript function, for example parseInt(cd, 2), to a decimal value, where the value 2 indicates a base 2 format. The decimal value can be converted into a two byte hexadecimal value, for example, by a function DecToHex, and pushed onto the "hexified" array. The result can be turned into a string and returned to the caller stored as a variable, "hexified" (Step S209).

The URL can be built by continuously breaking the data string "hexified" until the maximum allowed number of bytes of data allowed on the URL is reached (MaxURLLen−preDataLen). The length of the hexified data and an additional "L" delimiter, for the length can be represented by the variable "hexStrLen" and can be determined, for example, by a function getHexStrLen(bexStr.length)+"L" (Step S210). Another variable, for example, "fullHexLen", can represent the sum of the encoding tree length, the hexadecimal string length, and the hexified array length (Step S210). A multi-URL flag can be defined by the following equation: fullHexLen−preDataLen>MaxURLLen.

Once the data lengths are all determined, the algorithm can determine how to process the data. The bexified string can be replaced with the entire data string combination composed of the encoding tree, the multi-URL flag indicating that the server needs to go back and obtain more data, the hexadecimal string length, and the hexified data string (Step S210). The hexified data string can be added to the URL parameter array, for example, using the following function: purlParms.pushb(exified). In addition, one of three possible modes can be selected (for example, "H" or "M") to indicate to the server whether the data is a Huffman encoded Multi-URL, a Huffman encoded single URL, or a non-Huffman encoded single URL (hexadecimal data string). If the data is not in a multi-URL format (No, Step S211), then the URL can be set to the value, for example, partialURL+purlParms.join(" "), and the value can be returned (Step S212). However, if the URL is a multi-URL (Yes, Step S211), then additional steps can be taken, as illustrated in FIG. 7.

Figure 7:
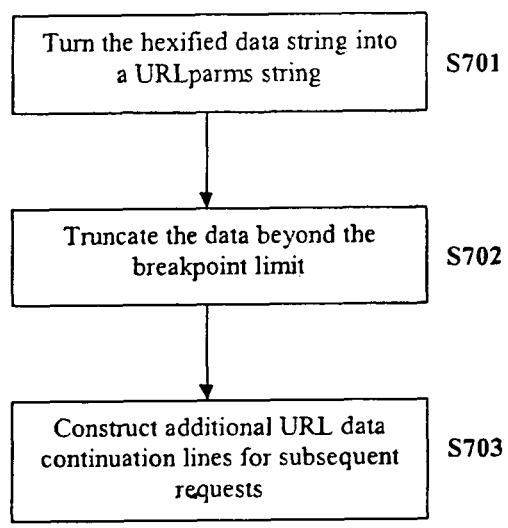
FIG. 7 shows a flow chart illustrating how the multi-URL aspect is handled, according to an embodiment of the present disclosure.

FIG. 7 is a flow chart illustrating how the multi-URL aspect is handled, according to an embodiment of the present disclosure. If the multi-URL flag is true, then the hexified data string that is added to the URL parameter can be turned into a urlParms string (Step S701). The URL to be returned by the algorithm can be obtained by the following function, partialURL+URLParms.substring(o, breakpoint), which can truncate the data beyond a breakpoint limit (MaxURLLen−preDataLEn) (Step S702). The variable partialURL can be appended with the remaining data prefix "&PageData=", since URLParms will not be sent again after the first time. An additional array, for example, "DataContinue", can be created and can contain the additional URL data continuation lines for subsequent requests to send back to the server (Step S703). The data continuation lines can be constructed by a loop. For example, the loop can begin by creating an array, "dataContinuePart" and obtaining the next data line, by using, for example, the following function: remaining.substring(0, breakpoint). The value of "&PageData=" can be pushed onto the "dataContinuePart" array, and the remaining value can be reset to the value obtained from remaining.substring(breakpoint). If the remaining length is greater than zero, then an "M" can be pushed onto the "dataContinuePart" array to indicate to the server that there are more lines of data. The next data line can be pushed onto the "dataContinuePart" array, and the entire process can be repeated until the remaining length is equal to zero (which can terminate the loop). The array elements can then be reversed so that they can be popped off accordingly when the server requests the subsequent data lines.

Figure 8:
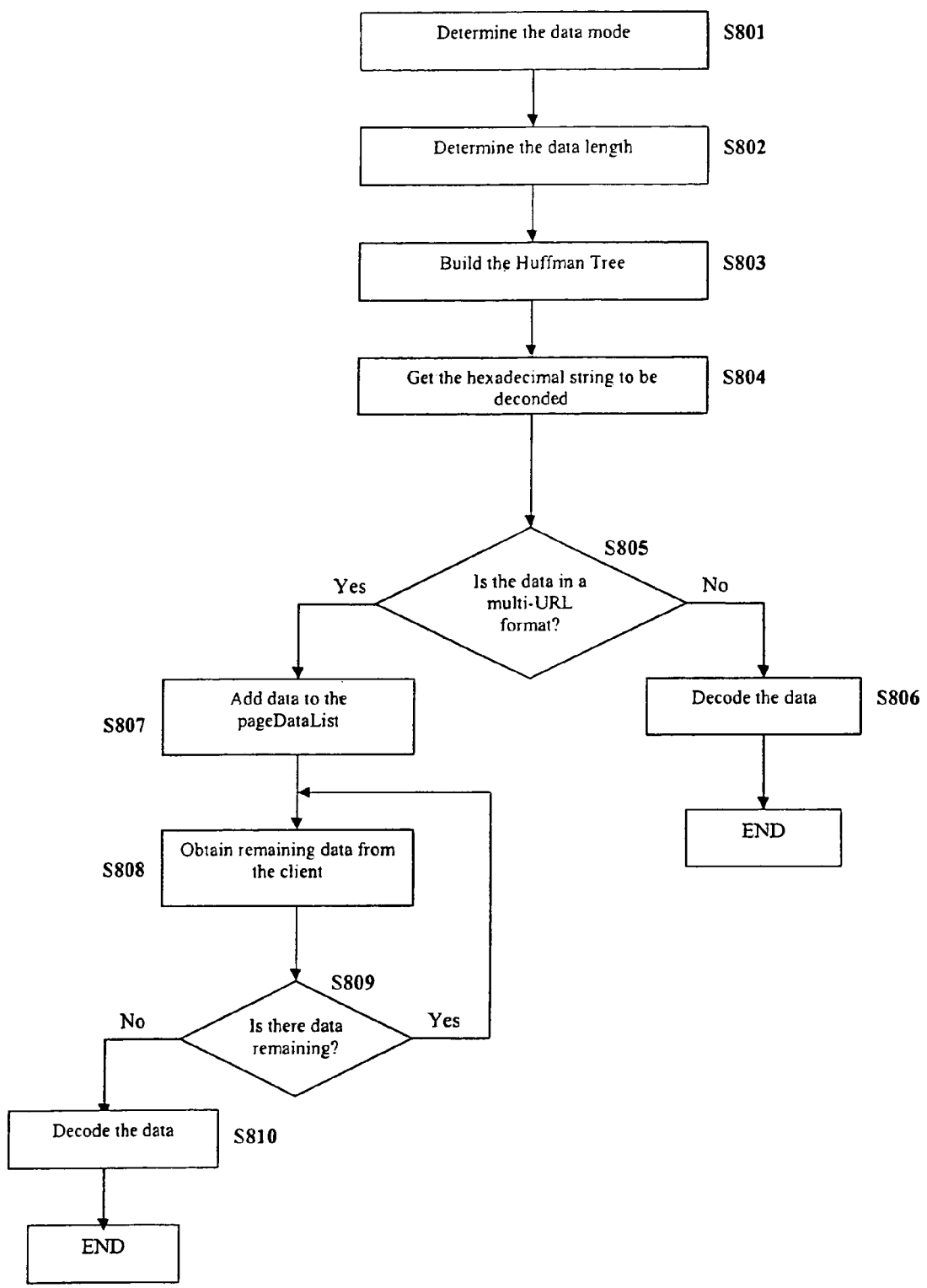
FIG. 8 shows a flow chart illustrating the algorithm for the server side implementation, according to an embodiment of the present disclosure.

The algorithm for the server side implementation can be described with reference to FIG. 8. The requests can be handled as are other requests parsing the parameters, and a function, for example, parsePageData(pageData) can be called. According to an embodiment of the present disclosure, in order to perform Huffman decoding, it can be determined what the data mode is (Step S801). For example, the data mode could be "H", indicating that the data is a Huffman encoded single URL, an "M", indicating that the data is a Huffman encoded multi-URL, or the data mode can indicate that the data is a non-Huffman encoded single URL (hexadecimal data string). The data length can be determined (Step S802) according to the following algorithm:

```
int dataLenOffest = start +1;
int dataOffset = pageData.indexOf("L", dataLenOffset);
//find End index of Data Length
String hexLen = pageData.substring(dataLenOffset,   //move dataOffset to
dataOffset++);
                                                  //Start index of data
pageDataLen = Integer.parseInt(hexLen, 16);
```

The tree can be built as follows (Step S803):
buildTree(pageData.substring(0, start); //construct the Huffman tree
The hexadecimal data string to be decoded can be obtained (Step S804) according to the following algorithm:
String hexData=pageData.substring(dataOffset);
Depending on whether the data is in a multi-URL or single URL mode, the following algorithm executes:

```
if(multiURL) {
    pageDataList = new ArrayList( );
    pageDataList.add(hexData);       //the undecoded code
} else {
    pageData = decodeTree(hexData);  //the code
}
```

The function parsePageData can return as follows:

```
return multiURL ? −1 :           //−1 indicates to caller
setParameterData(pageData);      that all data not
                                 //here yet
```

If it is determined that the data is not in a multi-URL mode (No, Step S805), then the data can be decoded (Step S806). However, if it is determined that the data is in a multi-URL mode (Yes, Step S805), the data is not decoded immediately and is delayed until all the data is returned. Instead, the data is added to the pageDataList (Step S807), as illustrated in the algorithm above, and the remaining data is obtained from the client (Step S808) according to the following:

```
function doMultiURL(srcPath,srcHref) {
    parent.requestType = "MULTIURL";
    var remaining = parent.dataContinue.pop( );
    doReplace(srcPath,srcHref, remaining);
}
```

When the last URL data continuation line is popped, it can be sent back to the server with a multi-URL request type. The server can handle this request by calling a method, for example, finishMultiURL( ), which can cause the same algorithm to be repeated so long as finishMultiURL returns a −1 (Yes, Step S809). If there is no data remaining (No, Step S809), then the data can be decoded (Step S810).

The finishMultiURL( ) method can get the page data, determine if there is more data to obtain, skip the "M" (multi-URL flag), if present, and append the hexadecimal data to the pageDataList. If the data is in a multi-URL format, then the function can return a −1 to get the remaining data. Otherwise, it can create the complete pageData string by concatenating all of the elements of the pageDataList, by using, for example, the following functions: setParameterData(decodeTree(pageDataBuf.toString( ))). The finishMultiURL( ) method can be executed according to the following algorithm:

```
String pageData = httpRequest.getParameterValues("PAGEDATA")[0];
boolean multiURL = pageData.indexOf('M') != −1;
int dataOffset = (multiURL ? 1:0);
String hexData = pageData.substring(dataOffset);
pageDataList.add(hexData);   //the undecoded code
```

According to an embodiment of the present disclosure, a method, setParameterData can create a string buffer large enough to contain the resulting converted data, for example, "unicodeCharBuf". The method can loop through the characters of the pageData. If it is determined that the data is in a non-multi-byte mode, and the next, character is a 'u', indicating the start of multi-byte Unicode data, then the method can search for the matching trailing 'u' in order to set the multi-byte ending index. Any other character, (other than the 'u' character), can be a hex digit; therefore, two characters can be taken together and converted, typecasting the integer into a character. The Unicode character can be appended to the string buffer, "unicodeCharBuf". If it is determined that the data is in a multi-byte mode, the same procedure is followed, however, four characters are taken from pageData at a time, instead of two characters. The method can clear the pageDataList before the next request, for example, pageDataList=null.

According to an embodiment of the present disclosure, a method, buildTree(String treeStr) can construct a Huffman tree in order for the server to decode the data sent by the client. The method can set a flag, for example, "moreLeaves" to true. It can loop through the characters of the tree string so long as there are more characters and the "moreleaves" flag is true. The method can begin by obtaining the first character, for example, "ch". If "ch" is equal to the value '1', then a new leaf node can be created in the Huffman tree as follows:
newNode=new TreeNode(nextParent, true);
newNode.setValue(treeStr.charAr(++charIndex);

If there are less than eight characters left in the tree string to process, then the "moreLeaves" flag can be set to true if there is a '1' in the remaining characters. If "ch" is equal to the value '0', then a new non-leaf node can be created as follows:

| | |
|---|---|
| newNode = new TreeNode(nextParent, false); | //an empty node to keep tree shape. |

If there is no root in the tree string, the root and nextParent can be set to point to newNode and the method can continue to the top of the loop to get the next character. Otherwise, if nextParent's left node is null, it can be set to newNode and if it is a non-leaf node, nextParent can be set to point to newNode. If nextParent's right node is null, it can be set to newNode, and if it is a non-leaf node, nextParent can be set to point to newNode.

If the right node is a leaf node, then a special algorithm can be used. Since the leaf may not have children, the node that could be the nextParent node can be found. The loop can start by setting newParent to the nextParent's parent. It can check to see if nextParent is the root node. If it is the root node, and the right node is null (can only occur once when transitioning to right branch of root), then the nextParent can be set to the root and the inner loop can be exited to get the remaining characters that build the right side of the tree. Otherwise, if it is the root node and the right node is not null, then the algorithm can exit because there is a fully balanced tree. If it was a root node, then nextParent can be set to newParent and the loop can continue as long as nextParent's right node is not null.

Other embodiments for achieving the above results can include eliminating the multi-URL flags that indicate additional URL data for the server to obtain. This could be eliminated by concatenating the strings on the server and determining if they achieve an overall length required. If they do not, the server can go back and get additional data. The first 'M' could be used for the length byte start position. Another embodiment can, instead of using hexadecimal for the original Unicode string, use comma-delimited decimal values. Another embodiment can, instead of using Huffman encoding, use a different compression, or none at all. In addition, it should be noted that for all the embodiments described herein, different letters can be used as delimiters, different languages can be used for the server implementation, and the data can be rearranged by, for example, placing the Huffman tree at the end instead of the beginning (i.e., by sending the data first and the tree last, etc.).

The present disclosure may be conveniently implemented using one or more conventional general purpose digital computers and/or servers programmed according to the teachings of the present disclosure. Appropriate software coding can readily be prepared based on the teachings of the present disclosure. The present disclosure may also be implemented by the preparation of application specific integrated circuits or by interconnecting an appropriate network of conventional component circuits.

Numerous additional modifications and variations of the present disclosure are possible in view of the above-teachings. It is therefore to be understood that within the scope of the appended claims, the present disclosure may be practiced other than as specifically described herein.

What is claimed is:

1. A method for compressing URL request parameters, comprising:
   receiving a URL request, the URL request comprising an address portion and a data portion, the data portion comprising a plurality of characters;
   converting at a web client, separately from the address portion, the data portion from a first form into at least a second form and combining the at least the second form with the address portion to form a converted URL request by:
      creating an array;
      determining whether each of the plurality of characters is in a single byte or multiple byte format; and
      if each of the plurality of characters is in multiple byte format:
         setting a flag and using starting and ending delimiters to denote to a receiving server that each of the plurality of characters is in multiple byte format;
         converting each of the plurality of characters from the first form into the second form; and
         pushing the converted plurality of characters onto the array; and
   communicating the converted URL request to the receiving server.

2. The method of claim 1, wherein at least a portion of the URL is the data portion comprising data.

3. The method of claim 1, wherein the first form is a decimal form and the second form is a hexadecimal form.

4. The method of claim 1, further comprising:
   determining whether the URL request exceeds a predetermined length based on a maximum number of bytes of data for the URL request; and
   wherein converting the data portion from the first form into at least the second form to form the converted URL request depends on the URL request exceeding the predetermined length.

5. The method of claim 1, wherein the converting step further comprises pushing the converted plurality of characters onto the array if the plurality of characters is in a single byte format.

6. The method of claim 1, further comprising compressing the second form into a third form if the length of the second form is greater than a predetermined length.

7. The method of claim 6, wherein the second form is a hexadecimal form and the third form is a Huffman encoded form.

8. The method of claim 7, wherein the Huffman encoded form comprises a Huffman tree and a Huffman encoded string.

9. The method of claim 8, wherein the Huffman tree is used by a server to decode the Huffman encoded string.

10. The method of claim 8, wherein the Huffman tree is created by creating a frequency array; calculating a number of rimes a character appears in a hexadecimal string; filling the frequency array with the characters from the hexadecimal string based on the number of times a character appears in the hexadecimal string; joining the two minimal characters together, where one character becomes a left child and the other character becomes a right child; and inserting combined characters into the frequency array.

11. The method of claim 10, wherein the joining and inserting steps are repeated until there are no characters left in the hexadecimal string.

12. The method of claim 8, wherein the Huffman encoded string is obtained from the Huffman tree by creating a first array; determining if a node of a frequency array is a leaf node; pushing a value '1' onto the first array and creating a hash table if it is determined that the node of the frequency array is a leaf node; pushing a value '0' onto the first array if it is determined that the node of the frequency array is not a leaf node; creating a second array; searching the frequency array for a character and pushing a value '0' onto the second array for every left node encountered and a value '1' onto the second array for every right node encountered, until the character is located; and pushing the value of the leaf node onto the first array.

13. The method of claim 12, wherein all the steps are repeated until the left and right nodes of the frequency array are null.

14. The method of claim 12, wherein the Huffman encoded string is obtained by looking up each character in the hash table.

15. The method of claim 8, wherein the Huffman encoded string is turned into a hexadecimal string.

16. A non-transitory system for compressing URL request parameters, comprising:
means for receiving, using a processor coupled to a non-transitory computer-readable medium, a URL request, the URL request comprising an address portion and a data portion, the data portion comprising a plurality of characters;
means for converting at a web client, separately from the address portion, using the processor coupled to the non-transitory computer-readable medium, the data portion from a first form into at least a second form and combining the at least the second form with the address portion to form a converted URL request by:
creating an array;
determining whether each of the plurality of characters is in a single byte or multiple byte format; and
if each of the plurality of characters is in multiple byte format:
setting a flag and using starting and ending delimiters to denote to a receiving server that each of the plurality of characters is in multiple byte format;
converting each of the plurality of characters from the first form into the second form; and
pushing the converted plurality of characters onto the array; and
means for communicating, using the processor coupled to the non-transitory computer-readable medium, the converted URL to the receiving server.

17. The system of claim 16, wherein at least a portion of the URL is the data portion comprising data.

18. The system of claim 16, wherein the first form is a decimal form and the second form is a hexadecimal form.

19. The system of claim 16, further comprising:
means for determining whether the URL request exceeds a predetermined length based on a maximum number of bytes of data for the URL request; and
wherein converting the data portion from the first form into at least the second form to form the converted URL request depends on the URL request exceeding the predetermined length.

20. The system of claim 16, wherein the means for converting further comprises means for pushing the converted plurality of characters onto the array if the plurality of characters is in a single byte format.

21. The system of claim 16, further comprising means for compressing the second form into a third form if the length of the second form is greater than a predetermined length.

22. The system of claim 21, wherein the second form is a hexadecimal form and the third form is a Huffman encoded form.

23. The system of claim 22, wherein the Huffman encoded form comprises a Huffman tree and a Huffman encoded string.

24. The system of claim 23, wherein the Huffman tree is used by a server to decode the Huffman encoded string.

25. The system of claim 23, wherein the Huffman tree is created through means for creating a frequency array; means for calculating a number of times a character appears in a hexadecimal string; means for filling the frequency array with the characters from the hexadecimal string based on the number of times a character appears in the hexadecimal string; means for joining the two minimal characters together, where one character becomes a left child and the other character becomes a right child; and means for inserting combined characters into the frequency array.

26. The system of claim 23, wherein the Huffman encoded string is obtained from the Huffman tree through means for creating a first array; means for determining if a node of a frequency array is a leaf node; means for pushing a value '1' onto the first array and means for creating a hash table if it is determined that the node of the frequency array is a leaf node; means for pushing a value '0' onto the first array if it is determined that the node of the frequency array is not a leaf node; means for creating a second array; means for searching the frequency array for a character and means for pushing a value '0' onto the second array for every left node encountered and a value '1' onto the second array for every right node encountered, until the character is located; and means for pushing the value of the leaf node onto the first array.

27. The system of claim 26, wherein the Huffman encoded string is obtained by looking up each character in the hash table.

28. The system of claim 23, wherein the Huffman encoded string is turned into a hexadecimal string.

29. A non-transitory computer readable storage medium including code, the code, when executed by a processor, operable to:
receive a URL request, the URL request comprising an address portion and a data portion, the data portion comprising a plurality of characters;
convert at a web client, separately from the address portion, the data portion from a first form into at least a second form and combining the at least the second form with the address portion to form a converted URL request by:
creating an array;
determining whether each of the plurality of characters is in a single byte or multiple byte format; and
if each of the plurality of characters is in multiple byte format:
setting a flag and using starting and ending delimiters to denote to a receiving server that each of the plurality of characters is in multiple byte format;
converting each of the plurality of characters from the first form into the second form; and
pushing the converted plurality of characters onto the array; and
communicate the converted URL request to the receiving server.

30. The non-transitory computer readable storage medium of claim 29, wherein at least a portion of the URL is the data portion comprising data.

31. The non-transitory computer readable storage medium of claim 29, wherein the first form is a decimal form and the second form is a hexadecimal form.

32. The non-transitory computer readable storage medium of claim 29, the code further operable to:
determine whether the URL request exceeds a predetermined length based on a maximum number of bytes of data for the URL request; and
wherein converting the data portion from the first form into at least the second form to form the converted URL request depends on the URL request exceeding the predetermined length.

33. The non-transitory computer readable storage medium of claim 29, wherein converting further comprises pushing the converted plurality of characters onto the array if the plurality of characters is in a single byte format.

34. The non-transitory computer readable storage medium of claim 29, the code further operable to compress the second form into a third form if the length of the second form is greater than a predetermined length.

35. The non-transitory computer readable storage medium of claim 34, wherein the second form is a hexadecimal form and the third form is a Huffman encoded form.

36. The non-transitory computer readable storage medium of claim 35, wherein the Huffman encoded form comprises a Huffman tree and a Huffman encoded string.

37. The non-transitory computer readable storage medium of claim 36, wherein the Huffman tree is used by a server to decode the Huffman encoded string.

38. The non-transitory computer readable storage medium of claim 36, wherein the Huffman tree is created by creating a frequency array; calculating a number of times a character appears in a hexadecimal string; filling the frequency array with the characters from the hexadecimal string based on the number of times a character appears in the hexadecimal string; joining the two minimal characters together, where one character becomes a left child and the other character becomes a right child; and inserting combined characters into the frequency array.

39. The non-transitory computer readable storage medium of claim 36, wherein the Huffman encoded string is obtained from the Huffman tree by creating a first array; determining if a node of a frequency array is a leaf node; pushing a value '1' onto the first array and creating a hash table if it is determined that the node of the frequency array is a leaf node; pushing a value '0' onto the first array if it is determined that the node of the frequency array is not a leaf node; creating a second array; searching the frequency array for a character and code for pushing a value '0' onto the second array for every left node encountered and a value '1' onto the second array for every right node encountered, until the character is located; and pushing the value of the leaf node onto the first array.

40. The non-transitory computer readable storage medium of claim 39, wherein the Huffman encoded string is obtained by looking up each character in the hash table.

41. The non-transitory computer readable storage medium of claim 36, wherein the Huffman encoded string is turned into a hexadecimal string.

42. The method of claim 1, further comprising:
determining if the converted URL request exceeds a predetermined length; and
if the converted URL request exceeds the predetermined length, truncating the converted URL request to form a partial converted URL request and using a delimiter to denote to the receiving server that the converted URL request comprises the partial converted URL request.

43. The system of claim 16, further comprising:
means for determining if the converted URL request exceeds a predetermined length; and
if the converted URL request exceeds the predetermined length, means for truncating the converted URL request to form a partial converted URL request and means for using a delimiter to denote to the receiving server that the converted URL request comprises the partial converted URL request.

44. The non-transitory computer readable storage medium of claim 29, the code further operable to:
determine if the converted URL request exceeds a predetermined length; and
if the converted URL request exceeds the predetermined length, truncate the converted URL request to form a partial converted URL request and use a delimiter to denote to the receiving server that the converted URL request comprises the partial converted URL request.

* * * * *